(12) United States Patent
You et al.

(10) Patent No.: US 9,312,316 B2
(45) Date of Patent: *Apr. 12, 2016

(54) ORGANIC LIGHT EMITTING DIODE DISPLAY AND MANUFACTURING METHOD OF THE SAME

(71) Applicant: SAMSUNG DISPLAY CO., LTD., Yongin, Gyeonggi-Do (KR)

(72) Inventors: Chun-Gi You, Yongin (KR); Joon-Hoo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

This patent is subject to a terminal disclaimer.

(21) Appl. No.: 14/165,331

(22) Filed: Jan. 27, 2014

(65) Prior Publication Data

US 2014/0138668 A1 May 22, 2014

Related U.S. Application Data

(63) Continuation of application No. 13/206,423, filed on Aug. 9, 2011, now Pat. No. 8,637,333.

(30) Foreign Application Priority Data

Dec. 30, 2010 (KR) .................. 10-2010-0139428

(51) Int. Cl.
| | | |
|---|---|---|
| *H01L 51/52* | (2006.01) | |
| *H01L 51/54* | (2006.01) | |
| *H01L 27/32* | (2006.01) | |
| *H01L 51/56* | (2006.01) | |

(52) U.S. Cl.
CPC ........ *H01L 27/3244* (2013.01); *H01L 51/5246* (2013.01); *H01L 51/5253* (2013.01); *H01L 51/5259* (2013.01); *H01L 51/56* (2013.01)

(58) Field of Classification Search
CPC .................... H01L 51/5246; H01L 27/32
See application file for complete search history.

(56) References Cited

U.S. PATENT DOCUMENTS

| | | | |
|---|---|---|---|
| 7,652,305 B2 | 1/2010 | Chatterjee et al. | |
| 8,748,897 B2 * | 6/2014 | Choi et al. ................. | 257/59 |
| 8,907,331 B2 * | 12/2014 | Jinta et al. ................. | 257/40 |
| 8,981,359 B2 * | 3/2015 | Kum et al. ................. | 257/40 |
| 9,029,847 B2 * | 5/2015 | Lee et al. ................... | 257/40 |

(Continued)

FOREIGN PATENT DOCUMENTS

| | | |
|---|---|---|
| CN | 1509125 A | 6/2004 |
| EP | 1 868 246 | 12/2007 |

(Continued)

*Primary Examiner* — Evan Pert
(74) *Attorney, Agent, or Firm* — Lewis Roca Rothgerber Christie LLP

(57) ABSTRACT

An organic light emitting diode (OLED) display includes: a first substrate including a display area and a non-display area; a driving element on the display area of the first substrate, and including a driving thin film transistor, a switching thin film transistor, and a capacitor; a circuit unit on the non-display area of the first substrate; an organic light emitting element on the driving element, and including a pixel electrode, an organic emission layer, and a common electrode; an inorganic protective layer covering the circuit unit and the common electrode of the organic light emitting diode; a sealing member on the inorganic protective layer in the non-display area of the first substrate; and a second substrate on the sealing member.

24 Claims, 10 Drawing Sheets

(56) References Cited

U.S. PATENT DOCUMENTS

| | | |
|---|---|---|
| 2004/0206953 A1 | 10/2004 | Morena et al. |
| 2006/0163565 A1 | 7/2006 | Park et al. |
| 2008/0303424 A1 | 12/2008 | Mitsuya et al. |
| 2010/0181557 A1 | 7/2010 | Sun |
| 2010/0244005 A1 | 9/2010 | Gyoda |
| 2011/0114991 A1 | 5/2011 | Lee |
| 2012/0181526 A1 | 7/2012 | Kasahara et al. |

FOREIGN PATENT DOCUMENTS

| | | |
|---|---|---|
| KR | 10-0703518 B1 | 3/2007 |
| KR | 10-0838082 B1 | 6/2008 |
| KR | 10-0908727 B1 | 7/2009 |

* cited by examiner

ORGANIC LIGHT EMITTING DIODE DISPLAY AND MANUFACTURING METHOD OF THE SAME

CROSS-REFERENCE TO RELATED APPLICATIONS

This application is a continuation of U.S. patent application Ser. No. 13/206,423, filed Aug. 9, 2011, which claims priority to and the benefit of Korean Patent Application No. 10-2010-0139428, filed Dec. 30, 2010, the entire content of both of which is incorporated herein by reference.

BACKGROUND

1. Field

The described technology relates generally to an organic light emitting diode (OLED) display and a manufacturing method thereof.

2. Description of Related Art

An organic light emitting diode (OLED) display is a flat panel display which can be made lightweight and thin because it has a self-luminous characteristic and requires no separate light source. Particularly, the OLED display exhibits quality characteristics such as low power consumption, high luminance, high response speed, and as such, the OLED display receives much attention as a next-generation display device.

In general, an OLED display includes an organic light emitting element and a thin film transistor for driving the same. A pixel defining layer (PDL) defining a pixel area is formed on the thin film transistor, and the organic light emitting element is formed in the pixel area. The organic light emitting element includes an anode, a cathode, and an organic emission layer. Holes and electrons are injected from the anode and the cathode, respectively, to form excitons, and the excitons make a transition to a ground state, thereby causing the organic light emitting diode to emit light.

The organic light emitting element formed with an organic material may deteriorate in performance when combined with moisture or oxygen, and therefore an encapsulation technique is used in the OLED display to prevent moisture and oxygen from penetrating the display. In general, an encapsulation substrate formed with glass or a metal may be used to encapsulate a display substrate where the organic light emitting element is formed, and the encapsulation substrate may be adhered to the display substrate using a sealant.

The sealant is applied (or coated) between the display substrate and the encapsulation substrate, and hardened by an ultraviolet (UV) laser irradiated thereto. A circuit unit or a wire unit that electrically connects the organic light emitting element with external devices is formed on the display substrate of the OLED display, and when the sealant is applied to (or coated on) the circuit unit or the wire unit, the circuit unit or the wire unit may be damaged during a sealant hardening process.

Thus, the sealant may be applied (or coated) so as to avoid the circuit unit or the wire unit, such that a dead space is increased at the outer side of the display substrate. Particularly, when the OLED display is increased in size, a getter may be additionally formed in addition to the sealing member, and the getter causes the dead space to be further increased.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed toward an organic light emitting diode (OLED) display for reducing a dead space, and a manufacturing method thereof.

Further, aspects of embodiments of the present invention are directed toward an OLED display that can protect an organic light emitting element formed in a display area of a display substrate and a circuit unit formed in a non-display area of the display substrate, and can improve adhesiveness between the display substrate and an encapsulation substrate, and a manufacturing method thereof.

An organic light emitting diode (OLED) display according to an exemplary embodiment includes: a first substrate including a display area and a non-display area; a driving element on the display area of the first substrate, and including a driving thin film transistor, a switching thin film transistor, and a capacitor; a circuit unit on the non-display area of the first substrate; an organic light emitting element on the driving element, and including a pixel electrode, an organic emission layer, and a common electrode; an inorganic protective layer covering the circuit unit and the common electrode of the organic light emitting diode; a sealing member on the inorganic protective layer in the non-display area of the first substrate; and a second substrate on the sealing member.

The OLED display may further include a getter on the inorganic protective layer in the non-display area of the first substrate, the getter being closer to the display area than the sealing member is.

The sealing member may be at a location at least partially overlapping the circuit unit.

The OLED display may further include a getter on the inorganic protective layer in the non-display area of the first substrate, the getter being closer to the display area than the sealing member is.

The inorganic protective layer may include silicon nitride (SiNx) or silicon oxide (SiOx).

The OLED display may further include a getter on the inorganic protective layer in the non-display area of the first substrate, the getter being closer to the display area than the sealing member is.

The sealing member may include epoxy or frit.

The OLED display may further include a getter on the inorganic protective layer in the non-display area of the first substrate, the getter being closer to the display area than the sealing member is.

The first substrate and the second substrate may be formed of glass.

The OLED display may further include a getter on the inorganic protective layer in the non-display area of the first substrate, the getter being closer to the display area than the sealing member is.

A method for manufacturing an organic light emitting diode (OLED) display according to another exemplary embodiment includes: forming a driving element and a circuit unit in a display area and a non-display area of a first substrate, respectively, the driving element including a thin film transistor, a switching transistor, and a capacitor; forming an organic light emitting element, including a pixel electrode, an organic emission layer, and a common electrode, on the driving element; forming an inorganic protective layer to cover the circuit unit and the common electrode of the organic light emitting element; applying a sealant to the inorganic protective layer in the non-display area of the first substrate; disposing a second substrate on the sealant; and adhering the first substrate and the second substrate to each other by hardening the sealant.

The method for manufacturing may further include forming a getter on the inorganic protective layer at a location in the non-display area of the first substrate, the getter being closer to the display area than the sealant is.

The sealant may be applied to a location at least partially overlapping the circuit unit.

The method for manufacturing may further include forming a getter on the inorganic protective layer at a location in the non-display area of the first substrate, the getter being closer to the display area than the sealant is.

The inorganic protective layer may include silicon nitride (SiNx) or silicon oxide (SiOx).

The method for manufacturing may further include forming a getter on the inorganic protective layer at a location in the non-display area of the first substrate, the getter being closer to the display area than the sealant is.

The sealant may include epoxy or frit.

The method for manufacturing may further include forming a getter on the inorganic protective layer at a location in the non-display area of the first substrate, the getter being closer to the display area than the sealant is.

The first substrate and the second substrate may be formed of glass.

The method for manufacturing may further include forming a getter on the inorganic protective layer at a location in the non-display area of the first substrate, the getter being closer to the display area than the sealant is.

The sealant may be hardened by irradiating ultraviolet (UV) light thereto.

The method for manufacturing may further include forming a getter on the inorganic protective layer at a location in the non-display area of the first substrate, the getter being closer to the display area than the sealant is.

According to exemplary embodiments, the sealing member is formed to be at least partially overlapped with the circuit unit at the outer side of the display substrate so that the dead space can be reduced.

Further, the sealant may be coated on the inorganic protective layer so that damage to the organic light emitting element and the circuit unit during a substrate adhering process can be prevented, and adhesiveness of the sealant can be improved.

DETAILED DESCRIPTION

Figure 1:
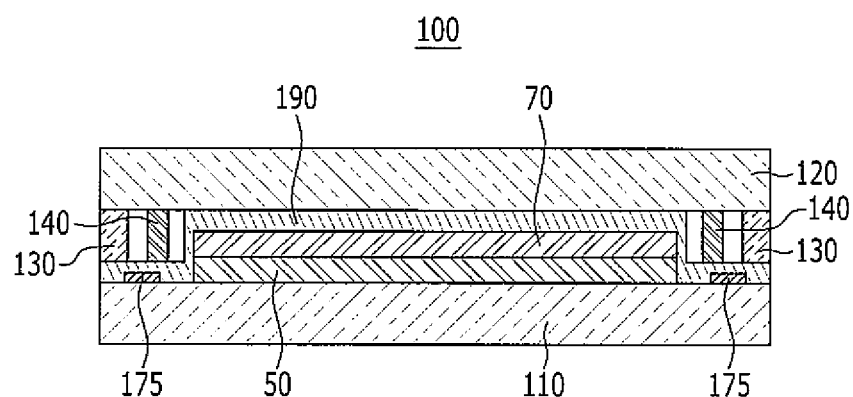
FIG. 1 is a schematic cross-sectional view of an organic light emitting diode (OLED) display according to an exemplary embodiment.

The present invention will be described more fully hereinafter with reference to the accompanying drawings, in which exemplary embodiments of the invention are shown.

The drawings and description are to be regarded as illustrative in nature and not restrictive. Like reference numerals designate like elements throughout the specification. In the drawings, for better understanding and ease of description, thicknesses of some layers and areas are excessively displayed, but the present invention is not limited thereto.

It will be understood that when an element such as a layer, film, region, or substrate is referred to as being "on" another element, it can be directly on the other element or intervening elements may also be present therebetween.

FIG. 1 is a schematic cross-sectional view of an organic light emitting diode (OLED) display according to an exemplary embodiment, and a configuration of an OLED display 100 according to the present exemplary embodiment will be described with reference to FIG. 1.

Referring to FIG. 1, an OLED display 100 according to the present exemplary embodiment includes a first substrate 110, a second substrate 120, and a sealing member 130 disposed between the first substrate 110 and the second substrate 120. In the present exemplary embodiment, the first substrate 110 indicates a display substrate, and the second substrate 120 indicates an encapsulation substrate for sealing the display substrate.

The first substrate 110 includes a display area that substantially displays an image by emitting light, and a non-display area. A driving element 50 and an organic light emitting element 70 are formed on the display area of the first substrate 110. The driving element 50 includes a thin film transistor formed of a plurality of electrodes, and a semiconductor layer and a capacitor, and drives the organic light emitting element 70 using them. The thin film transistor includes a driving thin film transistor and a switching thin film transistor.

A circuit unit 175 is formed on the non-display area of the first substrate 110. In the circuit unit 175, a wire pattern is formed to electrically connect the organic light emitting element 70 with an external device.

The OLED display 100 according to the present exemplary embodiment may further include a getter 140. The getter 140 is formed on the non-display area of the first substrate 110 to extend the life-span and improve the reliability of the organic light emitting element by reducing (or eliminating) moisture or oxygen inside the OLED display 100. The getter 140 is disposed closer to the display area than the sealing member 130.

In the present exemplary embodiment, an inorganic protective layer 190 is formed on the organic light emitting element 70 and the circuit unit 175 respectively formed on the display area and the non-display area of the first substrate 110. Accordingly, in the display area, the inorganic protective layer 190 can protect the organic light emitting element 70 by contacting the second substrate 120. In the non-display area, the inorganic protective layer 190 is disposed between (or at) the circuit unit 175 and a lower portion of the sealing member 130 and the getter 140, to protect the circuit unit 175.

Figure 2:
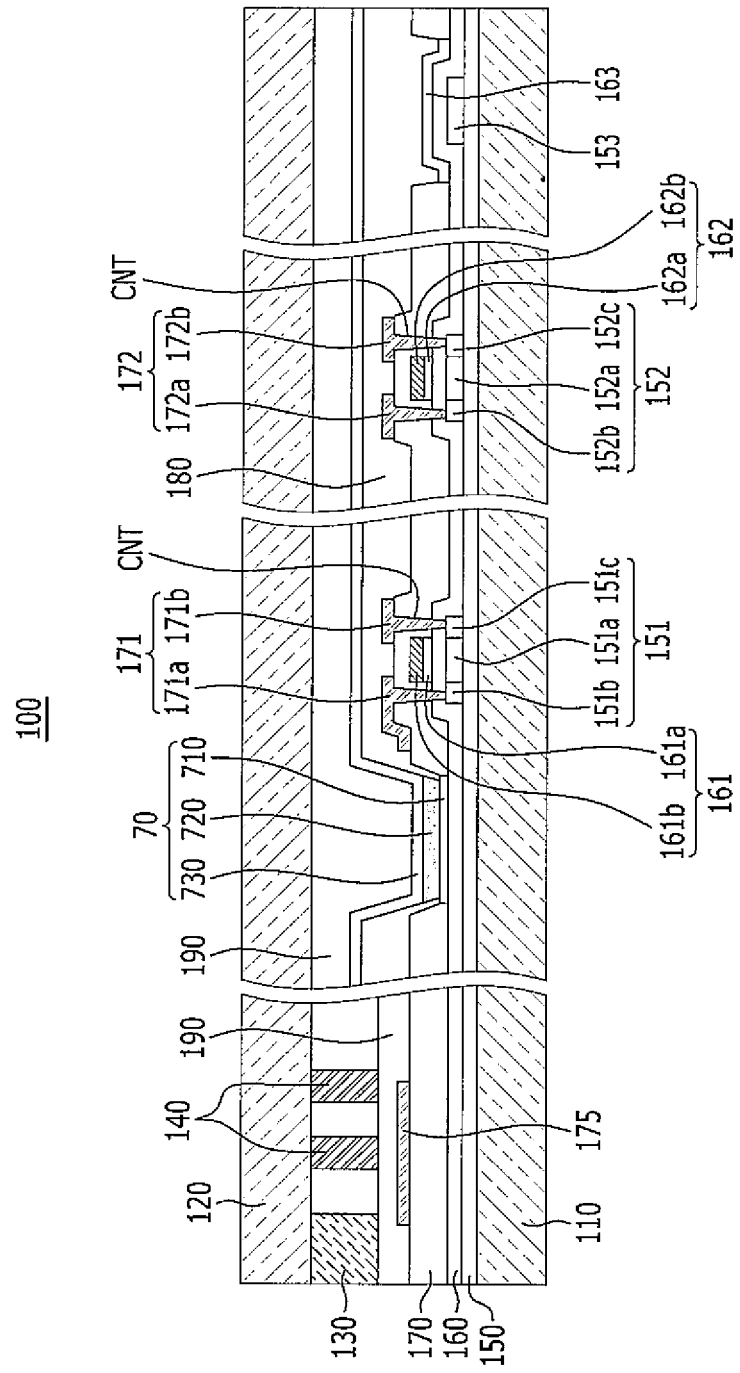
FIG. 2 is an enlarged cross-sectional view of an OLED display according to an exemplary embodiment.

FIG. 2 is an enlarged cross-sectional view of an OLED display according to an exemplary embodiment. In further detail, in FIG. 2, the left side of the drawing is an enlarged view of the non-display area of the OLED display 100, and the rest is an enlarged view of the display area of the OLED display 100 where the driving thin film transistor, the switching thin film transistor, and the capacitor are formed. Hereinafter, the configuration of the OLED display 100 according to the present exemplary embodiment will be described in further detail with reference to FIG. 2.

Referring to FIG. 2, the first substrate 110 and the second substrate 120 are arranged opposite to each other, interposing the sealing member 130 and the getter 140 therebetween. The first substrate 110 and the second substrate 120 may be respectively formed with an insulating material such as glass, quartz, or ceramic.

A buffer layer 150 is formed on the first substrate 110. In one embodiment, the buffer layer 150 is formed with silicon nitride (SiNx), silicon oxide (SiOx), and/or silicon oxynitride (SiOxNy). Here, the buffer layer 150 may be omitted according to the material and the processing condition of the first substrate 110.

The driving thin film transistor, the switching thin film transistor, and the capacitor are formed on the buffer layer 150. The driving thin film transistor includes a driving semiconductor layer 151, a driving gate electrode 161, and a driving source/drain electrode 171, and the switching thin film transistor includes a switching semiconductor layer 152, a switching gate electrode 162, and a switching source/drain electrode 172. Further, the capacitor includes a first capacitor plate 153 and a second capacitor plate 163. The thin film transistors and the capacitor will be described according to the layering sequence of the respective constituent elements.

The driving semiconductor layer 151, the switching semiconductor layer 152, and the first capacitor plate 153 are formed on the buffer layer 150. In one embodiment, the driving semiconductor layer 151 and switching semiconductor layer 152 are formed with a polycrystalline silicon layer, and respectively include channel areas 151a and 152a that are not doped with any impurities, and p+ doped source/drain areas 151b, 151c, 152b, and 152c respectively formed on opposite sides of the channel regions 151a and 152a. Here, the type of the impurity may vary according to the type of the thin film transistor.

A gate insulating layer 160 is formed on the driving semiconductor layer 151, the switching semiconductor layer 152, and the first capacitor plate 153. The gate insulating layer 160 may be formed with silicon nitride or silicon oxide.

The driving gate electrode 161, the switching gate electrode 162, and the second capacitor plate 163 are formed on the gate insulating layer 160, and a pixel electrode 710 is formed in a pixel area. The driving gate electrode 161 and the switching gate electrode 162 respectively include transparent layers 161a and 162a and metal layers 161b and 162b, and are connected with gate lines formed of a lower gate line and an upper gate line.

The pixel electrode 710, the transparent layers 161a and 162a of the gate electrode and the lower gate line may be formed with a transparent conductive material such as indium tin oxide (ITO) or indium zinc oxide (IZO). In addition, the metal layers 161b and 162b and the upper gate line may be formed with a low resistance metal such as aluminum, copper, silver, or molybdenum. The transparent layers 161a and 162a suppress lift-off or peeling by enhancing adhesiveness with the gate insulating layer 160, and the metal layers 161b and 162b prevent a signal delay by enhancing conductivity thereof. The metal layers 161b and 162b and the upper gate line may have a multi-layered structure.

An interlayer insulating layer 170 is formed on the driving gate electrode 161 and the switching gate electrode 162. In the interlayer insulating layer 170, contact holes CNT that expose the source/drain areas 151b, 151c, 152b, and 152c of each of the driving semiconductor layer 151 and the switching semiconductor layer 152 is formed. In addition, a pixel opening and a capacitor plate opening are formed in the interlayer insulating layer 170 to respectively expose most of the pixel electrode 710 and the second capacitor plate 163. Like the gate insulating layer 160, the interlayer insulating layer 170 may include silicon nitride or silicon oxide.

The driving source/drain electrode 171 and the switching source/drain electrode 172 are formed on the interlayer insulating layer 170. The driving drain electrode, the driving source electrode, the switching drain electrode, and the switching source electrode 171a, 171b, 172a, and 172b are respectively connected with the source/drain areas 151b, 151c, 152b, and 152c of the driving semiconductor layer 151 and the switching semiconductor layer 152. Here, the source electrodes 171b and 172b are connected with data lines crossing the gate lines in an insulated manner.

As described above, the capacitor includes the first capacitor plate 153 and the second capacitor plate 163, and the gate insulating layer interposed between the two capacitor plates functions as a dielectric material. The first capacitor plate 153 is connected with the driving gate electrode 161, and the second capacitor plate 163 is connected with common voltage line formed in parallel with the data line.

In the non-display area, the circuit unit 175 is formed on the interlayer insulating layer 170. The circuit unit 175 is connected with the data line and the common voltage line and applies a voltage thereto. The circuit unit 175 is formed on the interlayer insulating layer 170 in the present exemplary embodiment, but the circuit unit 175 may be formed on the buffer layer 150 or the gate insulating layer 160 and may include at least one of the electrode materials forming the thin film transistor.

In the display area, a pixel defining layer 180 is formed on the interlayer insulating layer 170 and the source/drain electrodes 171 and 172. A portion where the pixel defining layer 180 mostly becomes a non-light emission area is formed, and a pixel opening is formed in a portion corresponding to the pixel electrode 710 such that the portion becomes a light emission area, that is, a pixel area. The pixel defining layer 180 may be formed with resin such as polyacrylates-based resin and polyimides-based resin or may be formed with a silica-based inorganic material.

The organic emission layer 720 is formed on the pixel electrode 710, the common electrode 730 is formed on the organic emission layer 720 and the pixel defining layer 180, and the pixel electrode 710, the organic emission layer 720, and the common electrode 730 form the organic light emitting element 70.

The organic emission layer 720 is formed with a low molecular weight organic material or a high molecular weight organic material, and may have a multiple layered structure with more than one of an emissive layer, a hole injection layer (HIL), a hole transporting layer (HTL), an electron transporting layer (ETL), and an electron injection layer (EIL).

As described above, in the present exemplary embodiment, the pixel electrode 710 is formed with a transparent conductive material and the common electrode 730 is formed with a metal having a high reflectivity, and thus the OLED display 100 according to the present exemplary embodiment is formed as a bottom emission type so that light emitted from the organic emission layer 720 is transmitted in a direction of the first substrate 110. However, the present invention is not limited thereto, and the OLED display may be formed as a front emission type or a dual emission type by forming the common electrode as a transparent electrode.

Further, in the present exemplary embodiment, the pixel electrode 710 is formed as an anode, and the common electrode 730 is formed as a cathode, but the present invention is not limited thereto. That is, the pixel electrode and the common electrode may be formed as a cathode and an anode, respectively.

In the present exemplary embodiment, the inorganic protective layer 190 is formed on the common electrode 730 of the display area and the circuit unit 175 of the non-display area of the first substrate 110. The inorganic protective layer 190 is formed to wholly cover the common electrode 730 and the circuit unit 175 so that the common electrode 730 and the circuit unit 175 are not exposed to the outside. The inorganic protective layer 190 may be formed with silicon nitride or silicon oxide.

The sealing member 130 and the getter 140 are formed on the inorganic protective layer 190 of the non-display area of the first substrate 110. The sealing member 130 may be formed at a location that at least partially overlaps the circuit unit 175, and the sealing member 130 may be formed with epoxy or frit to seal the first substrate 110 and the second substrate 120. In addition, the getter 140 is provided to reduce (or eliminate) moisture or oxygen, and may include a metal such as calcium, barium, magnesium, titan, or a metal oxide, or a complex metal hydride.

The second substrate 120 is arranged on the sealing member 130 of the non-display area and the inorganic protective layer 190 of the display area.

As described, the OLED display 100 according to the present exemplary embodiment includes the inorganic protective layer 190 formed to cover the common electrode 730 of the organic light emitting element 70 and the circuit unit 175 of the non-display area so that the organic light emitting element 70 and the circuit unit 175 can be protected from the external environment. That is, when the second substrate 120 is sealed with the first substrate 110, damage due to scratching of the common electrode 730 can be reduced (or suppressed), and when the sealing member 130 is formed on the circuit unit 175, damage to the circuit unit 175 during a hardening process of a sealant can be reduced (or suppressed).

In addition, the sealing member 130 and the getter 140 can be formed on the circuit unit 175, and the dead space of the OLED display 100 can be reduced so that the substrate can be more effectively used.

FIG. 3A to FIG. 3H sequentially show a manufacturing method of an OLED display according to an exemplary embodiment. Hereinafter, a manufacturing method of an OLED display 100 according to the present exemplary embodiment will be described.

Figure 3A:
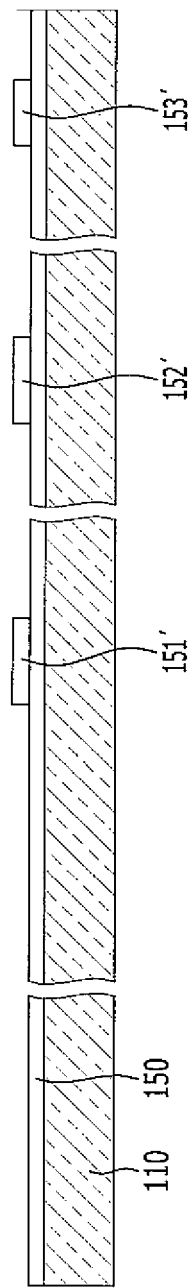
FIG. 3A to FIG. 3H sequentially show a manufacturing method of an OLED display according to an exemplary embodiment.

Referring to FIG. 3A, a buffer layer 150 is formed on a first substrate 110. The first substrate 110 is formed with an insulating material such as glass, quartz, or ceramic. The buffer layer 150 may be formed with silicon nitride, silicon oxide, or silicon oxynitride and may be deposited on the entire area of the first substrate 110.

An amorphous silicon layer is formed on the buffer layer 150 and then crystallized such that a polycrystalline silicon layer is formed. Various known methods using heat, lasers, electrical fields, or catalyst metals may be used for the crystallization. After the polycrystalline silicon layer is formed, the layer is patterned through a photolithography process using a first pattern mask such that a driving semiconductor layer 151', a switching semiconductor layer 152', and a first capacitor plate 153' are formed.

Figure 3B:
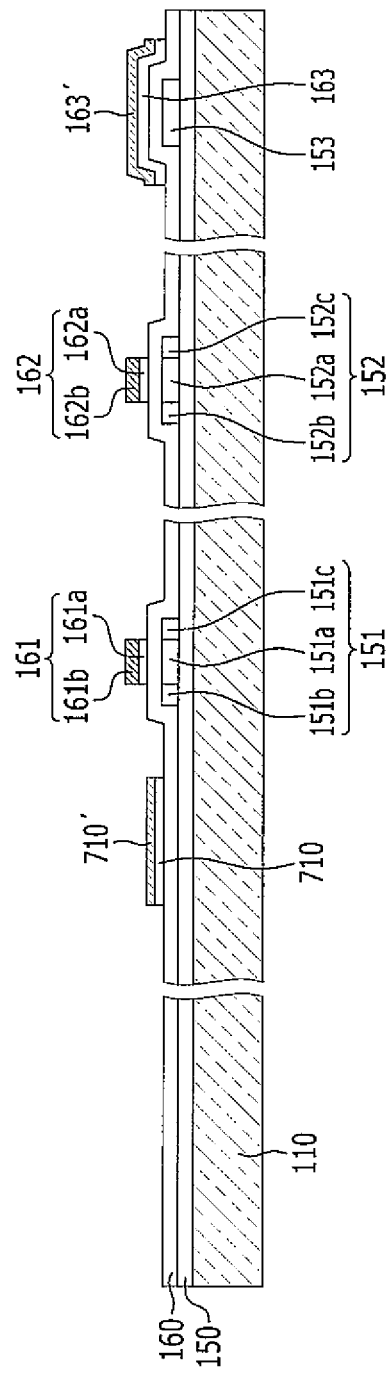

Referring to FIG. 3B, a gate insulating layer 160 is formed on the driving semiconductor layer 151', the switching semiconductor layer 152', and the first capacitor plate 153'. The gate insulating layer 160 may be formed with silicon nitride or silicon oxide, and is formed to cover the buffer layer 150 and the polycrystalline silicon layer using a plasma chemical vapor deposition (CVD) method or the like.

After the gate insulating layer 160 is formed, a transparent conductive layer and a gate metal layer are sequentially formed on the gate insulating layer 160. The transparent conductive layer and the metal layer are patterned through the photolithography process using a second pattern mask such that gate electrodes 161 and 162, pixel electrodes 710 and 710', second capacitor plates 163 and 163' and gate lines connected with the gate electrodes, pixel electrodes, and the second capacitor plates are formed. In this case, the transparent conductive layer may include ITO or IZO, and the gate metal layer may include a low resistance metal such as aluminum, copper, silver, molybdenum, and the like.

Sequentially, impurities are injected into semiconductor layers 151 and 152 using the gate electrodes 161 and 162 as a mask to form source/drain areas 151b, 151c, 152b, and 152c which are doped with the impurities and channel areas 151a and 152a which are not doped with the impurities.

Figure 3C:
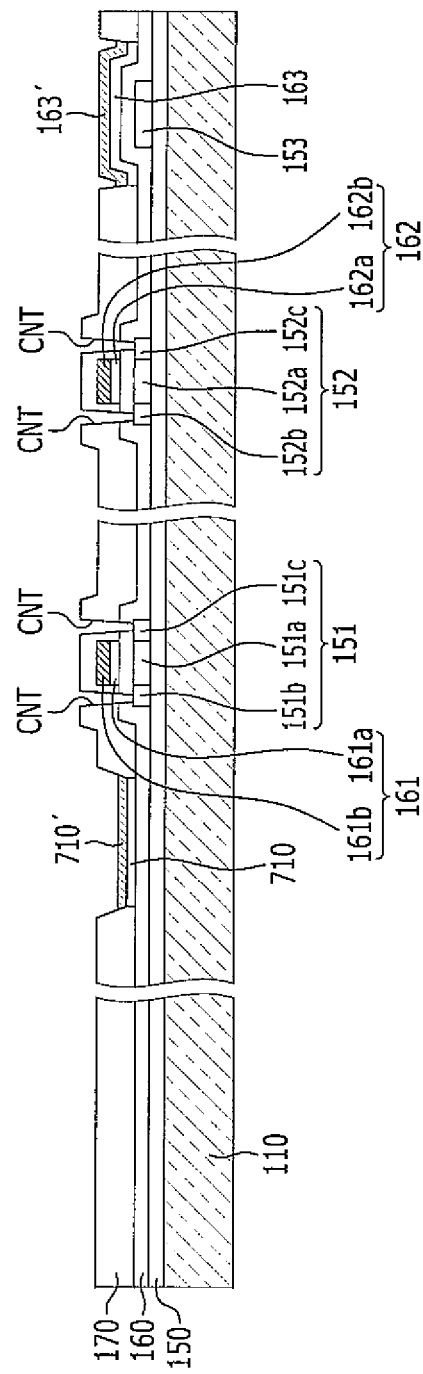

Referring to FIG. 3C, an interlayer insulating layer 170 is formed on the gate electrodes 161 and 162. The interlayer insulating layer 170 may be formed with silicon nitride or silicon oxide, and is formed to cover the gate insulating layer 160 and the gate electrodes 161 and 162.

Then, the interlayer insulating layer 170 is patterned through the photolithography process using a third pattern mask to expose the pixel electrodes 710 and 710' and the second capacitor plates 163 and 163'. In addition, contact holes CNT exposing the source/drain areas 151b, 151c, 152b, and 152c of the semiconductor layers 151 and 152 are formed through the interlayer insulating layer 170 and the gate insulating layer 160 by patterning the interlayer insulating layer 170.

Figure 3D:
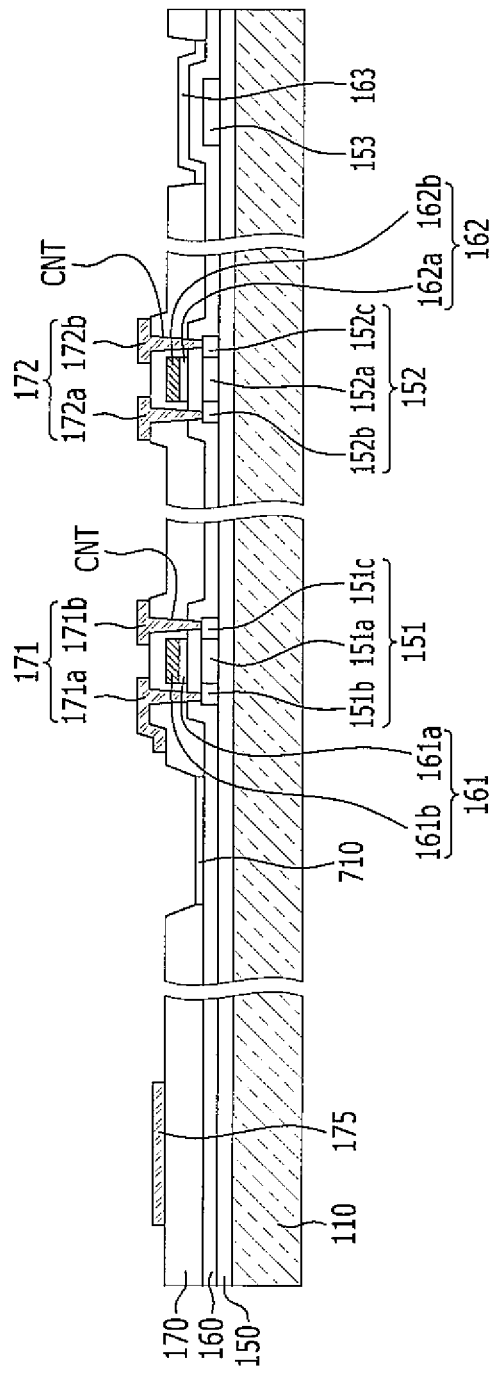

Referring to FIG. 3D, the transparent layer is exposed by etching the metal layers 710' and 163' of the pixel electrode 710 and the second capacitor plate 163, respectively. Sequentially, a data metal layer is formed on the interlayer insulating layer 170 and then patterning is performed through the photolithography process using a fourth pattern mask such that the source/drain electrodes 171 and 172 and data lines and common voltage lines connected with the source electrodes are formed. The source/drain electrodes 171 and 172 are respectively connected with the source/drain areas 151b, 151c, 152b, and 152c of the semiconductor layer 151 and 152 through the contact holes CNT. A circuit unit 175 connected with the data line and the common voltage line may be formed on the non-display area of the first substrate 110.

Figure 3E:
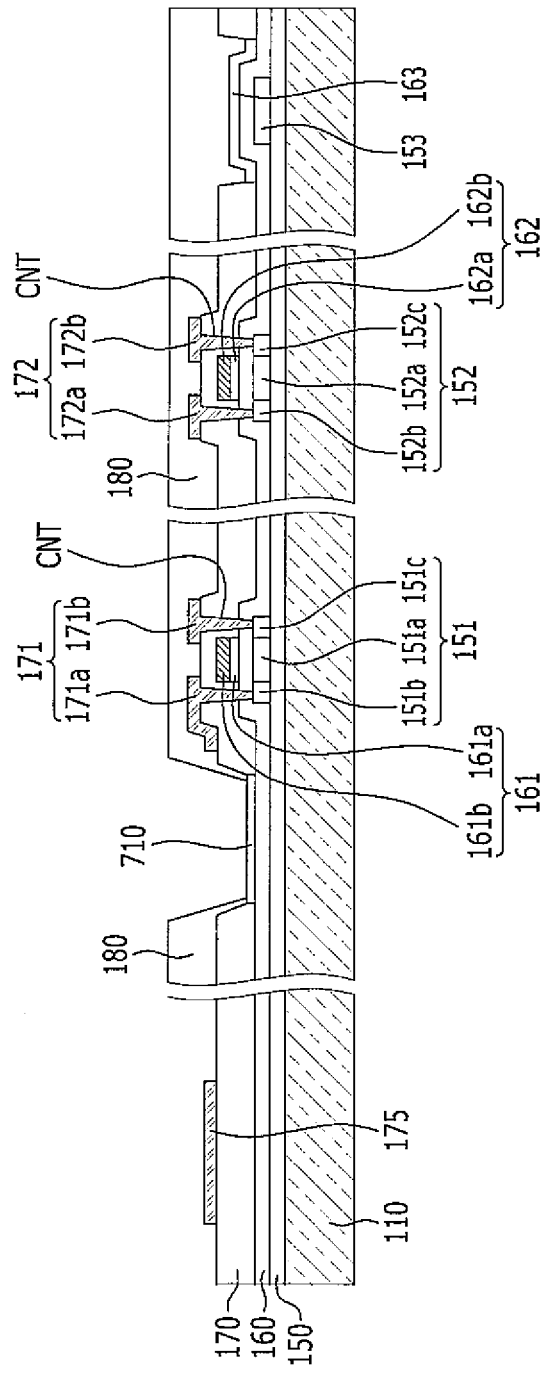

Referring to FIG. 3E, a pixel defining layer 180 is formed to cover the source/drain electrodes 171 and 172 on the interlayer insulating layer 170 in the display area of the first substrate 110. The pixel defining layer 180 has an opening partially exposing the pixel electrode 710. The opening is formed through the photolithography process using a fifth pattern mask. In this case, the opening corresponds to a light emission area, that is, a pixel area. The pixel defining layer 180 may be formed with polyacryl-based resin, polyamides-based resin, or silica-based inorganic material.

Figure 3F:
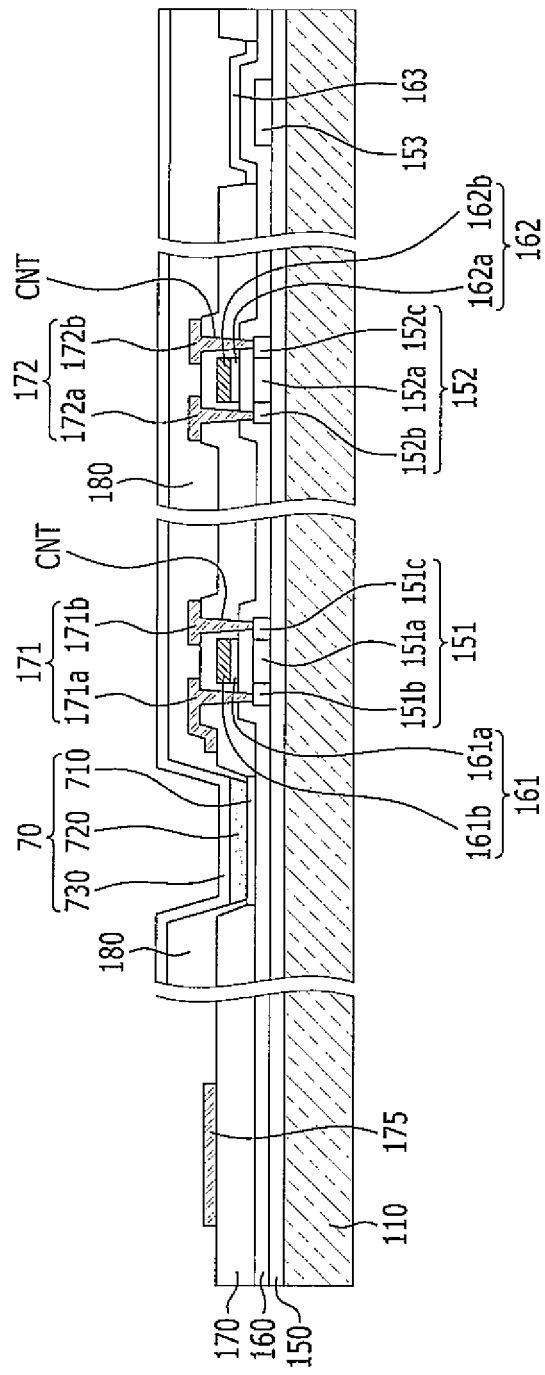

Referring to FIG. 3F, an organic emission layer 720 is formed on the pixel electrode 710, and a common electrode 730 is formed to cover the organic emission layer 720 and the pixel defining layer 180 on a display area of the first substrate 110 such that an organic light emitting element 70 is formed. The organic emission layer 720 may include at least one of a hole injection layer (HIL), a hole transport layer (HTL), an electron transport layer (ETL), and an electron injection layer (EIL). In the present exemplary embodiment, for realization of a bottom-emission structure, a material having high reflectivity and low resistivity such as magnesium, silver, aluminum, chromium, and an alloy thereof may be used to form the common electrode 730. Accordingly, light emitted from the organic emission layer 720 is reflected by the common electrode 730 and emitted through the pixel electrode 710 and the first substrate 110 to the outside such that an image can be displayed.

Figure 3G:
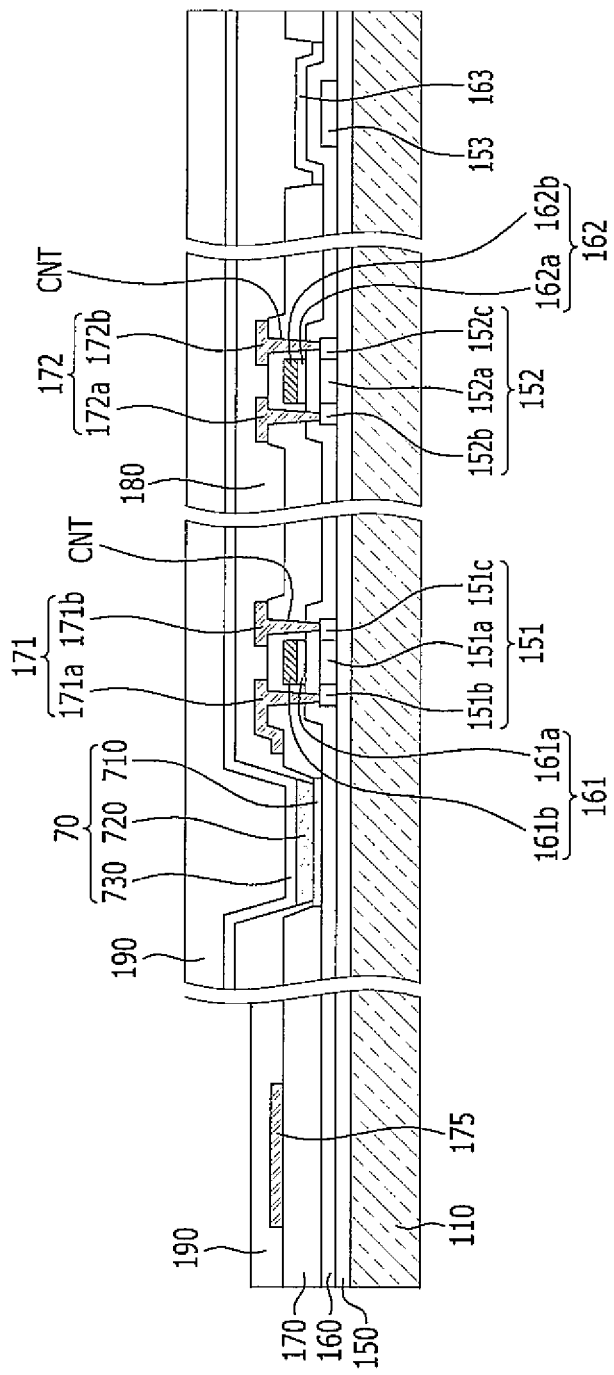

Referring to FIG. 3G, the inorganic protective layer 190 is formed on the first substrate 110. The inorganic protective layer 190 may be formed with silicon nitride or silicon oxide, and wholly covers the display area and the non-display area of the first substrate. Thus, the inorganic protective layer 190 covers the common electrode 730 of the display area and the circuit unit 175 of the non-display area such that the common electrode 730 and the circuit unit 175 are not exposed to the outside.

Figure 3H:
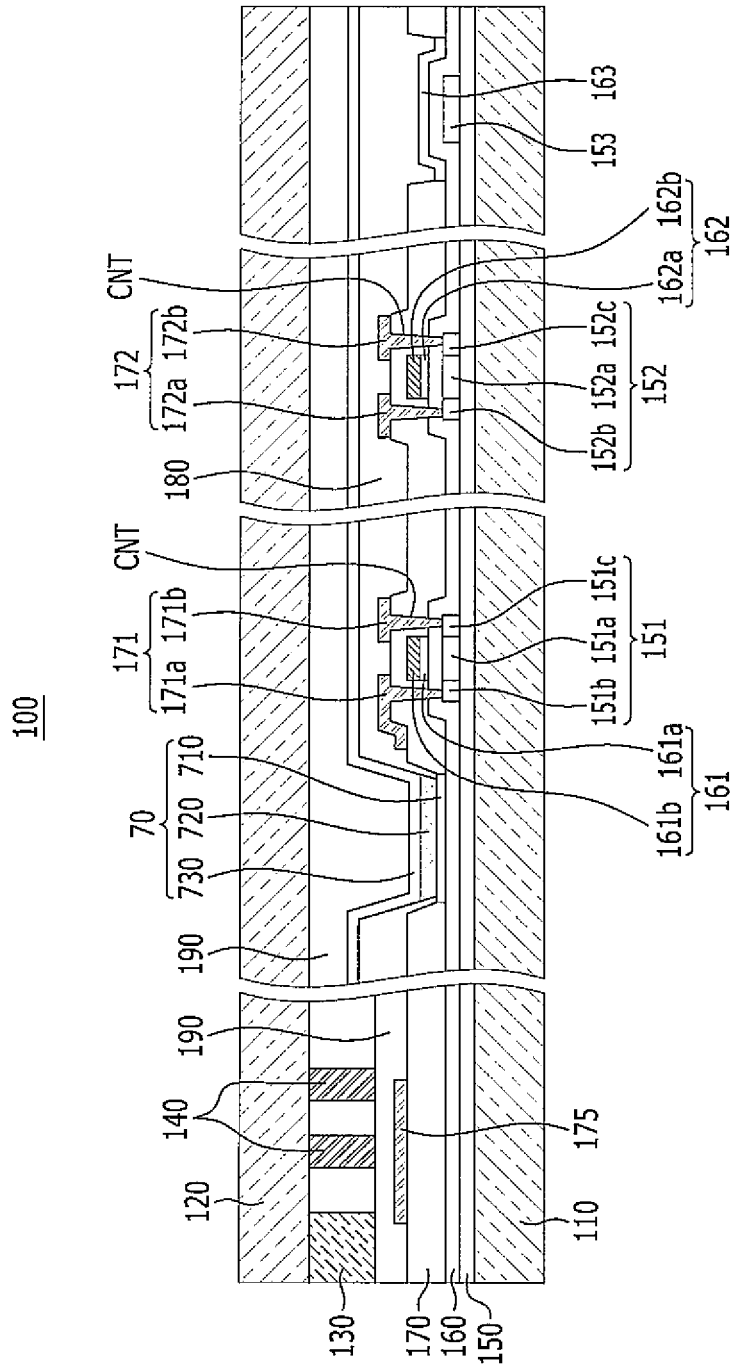

Referring to FIG. 3H, a sealant is applied to (or coated on) the inorganic protective layer 190 of the display area in the first substrate 110. The sealant may be coated on a location at feast partially overlapping the circuit unit 175 for more effective use of the substrate by reducing the dead space. Epoxy or frit may be used as the sealant, but the present invention is not limited thereto. After applying (or coating) the sealant, the second substrate 120 is arranged to be opposite to the first substrate 110 and the sealant is hardened such that the sealing member 130 is formed. The sealant may be hardened by irradiating ultraviolet (UV) light, and the first substrate 110 and the second substrate 120 are sealed to each other as the sealant is hardened.

During the sealant hardening process for sealing the first substrate 110 and the second substrate 120, the ultraviolet (UV) light is irradiated, and the circuit unit 175 of the non-display area may be exposed during the sealant hardening process so that the circuit unit 175 may be damaged.

However, in the present exemplary embodiment, the circuit unit 175 is covered by the inorganic protective layer 190 and thus ultraviolet (UV) light is not directly irradiated to the circuit unit 175 during the sealant hardening process so that the circuit unit 175 can be protected. Accordingly, the sealing member 130 can be formed by applying (or coating) the sealant on the circuit unit 175, thereby reducing the dead space. In addition, since the circuit unit 175 is not exposed to the outside and is protected by the inorganic protective layer 190, corrosion of the circuit unit 175 due to moisture can be prevented. Further, since the sealing member 130 is formed on the inorganic protective layer 190, the adhesiveness can be improved.

In the present exemplary embodiment, the inorganic protective layer 190 covers the common electrode 730 of the display area so that the common electrode 730 can be prevented from being scratched when the second substrate 120 is adhered to the first substrate 110, thereby protecting the organic light emitting element 70.

As described, according to the manufacturing method of the OLED display of the present exemplary embodiment, the OLED display 100 can be formed using only five masks, and the dead space can be reduced while protecting the organic light emitting element 70 and the circuit unit 175 so that the substrate can be more efficiently used.

In the present exemplary embodiment, a getter 140 may be further formed at an inner side of the sealing member 130. The getter 140 is provided to reduce (or eliminate) moisture or oxygen in the OLED display, and may include a metal such as calcium, barium, magnesium, titan, a metal oxide, or complex metal hydride. The getter 140 may also be formed on the circuit unit 175 covered by the inorganic protective layer 190 so that moisture or oxygen can be reduced (or eliminated) without increasing the dead space in the non-display area, thereby extending the life-span of the organic light emitting element 70.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and equivalents thereof.

| Description of Some of the Reference Numerals | |
|---|---|
| 100: organic light emitting diode (OLED) display | |
| 50: driving element | 70: organic light emitting element |
| 110: first substrate | 120: second substrate |
| 130: sealing member | 140: getter |
| 150: buffer layer | 151: driving semiconductor layer |
| 152: switching semiconductor layer | 153: first capacitor plate |
| 160: gate insulating layer | 161: driving gate electrode |
| 162: switching gate electrode | 163: second capacitor plate |
| 170: interlayer insulating layer | 171a: driving drain electrode |
| 171b: driving source electrode | 172a: switching drain electrode |
| 172b: switching source electrode | 175: circuit unit |
| 180: pixel defining layer | 190: inorganic protective layer |
| 710: pixel electrode | 720: organic emission layer |
| 730: common electrode | CNT: contact holes |

What is claimed is:

1. An organic light emitting diode (OLED) display comprising:
   a first substrate comprising a display area and a non-display area;
   a driving element on the display area of the first substrate;
   a circuit unit on the non-display area of the first substrate;
   an organic light emitting element on the driving element, and comprising a pixel electrode, an organic emission layer, and a common electrode; and
   an inorganic protective layer covering the circuit unit and the common electrode of the organic light emitting element.

2. The OLED display of claim 1, further comprising a sealing member on the inorganic protective layer in the non-display area of the first substrate and a second substrate on the sealing member.

3. The OLED display of claim 2, further comprising a getter on the inorganic protective layer in the non-display area of the first substrate, the getter being closer to the display area than the sealing member is.

4. The OLED display of claim 2, wherein the sealing member is at a location at least partially overlapping the circuit unit.

5. The OLED display of claim 4, further comprising a getter on the inorganic protective layer in the non-display area of the first substrate, the getter being closer to the display area than the sealing member is.

6. The OLED display of claim 2, wherein the inorganic protective layer comprises silicon nitride (SiNx) or silicon oxide (SiOx).

7. The OLED display of claim 6, further comprising a getter on the inorganic protective layer in the non-display area of the first substrate, the getter being closer to the display area than the sealing member is.

8. The OLED display of claim 2, wherein the sealing member comprises epoxy or frit.

9. The OLED display of claim 8, further comprising a getter on the inorganic protective layer in the non-display area of the first substrate, the getter being closer to the display area than the sealing member is.

10. The OLED display of claim 2, wherein the first substrate and the second substrate are formed of glass.

11. The OLED display of claim 10, further comprising a getter on the inorganic protective layer in the non-display area of the first substrate, the getter being closer to the display area than the sealing member is.

12. A method for manufacturing an organic light emitting diode (OLED) display, the method comprising:

forming a driving element and a circuit unit in a display area and a non-display area of a first substrate, respectively;

forming an organic light emitting element, comprising a pixel electrode, an organic emission layer, and a common electrode, on the driving element; and forming an inorganic protective layer to cover the circuit unit and the common electrode of the organic light emitting element.

13. The method of claim 12, further comprising:

applying a sealant to the inorganic protective layer in the non-display area of the first substrate;

disposing a second substrate on the sealant; and adhering the first substrate and the second substrate to each other by hardening the sealant.

14. The method of claim 13, further comprising forming a getter on the inorganic protective layer at a location in the non-display area of the first substrate, the getter being closer to the display area than the sealant is.

15. The method of claim 13, wherein the sealant is applied to a location at least partially overlapping the circuit unit.

16. The method of claim 15, further comprising forming a getter on the inorganic protective layer at a location in the non-display area of the first substrate, the getter being closer to the display area than the sealant is.

17. The method of claim 13, wherein the inorganic protective layer comprises silicon nitride (SiNx) or silicon oxide (SiOx).

18. The method of claim 17, further comprising forming a getter on the inorganic protective layer at a location in the non-display area of the first substrate, the getter being closer to the display area than the sealant is.

19. The method of claim 13, wherein the sealant comprises epoxy or frit.

20. The method of claim 19, further comprising forming a getter on the inorganic protective layer at a location in the non-display area of the first substrate, the getter being closer to the display area than the sealant is.

21. The method of claim 13, wherein the first substrate and the second substrate are formed of glass.

22. The method of claim 21, further comprising forming a getter on the inorganic protective layer at a location in the non-display area of the first substrate, the getter being closer to the display area than the sealant is.

23. The method of claim 13, wherein the sealant is hardened by irradiating ultraviolet (UV) light thereto.

24. The method of claim 23, further comprising forming a getter on the inorganic protective layer at a location in the non-display area of the first substrate, the getter being closer to the display area than the sealant is.

* * * * *